(12) United States Patent
Murtuza et al.

(10) Patent No.: US 10,204,890 B2
(45) Date of Patent: Feb. 12, 2019

(54) SUBSTRATE FOR SYSTEM IN PACKAGE (SIP) DEVICES

(71) Applicant: OCTAVO SYSTEMS LLC, Austin, TX (US)

(72) Inventors: Masood Murtuza, Sugar Land, TX (US); Gene Alan Frantz, Sugar Land, TX (US)

(73) Assignee: Octavo Systems LLC, Austin, TX (US)

( * ) Notice: Subject to any disclaimer, the term of this patent is extended or adjusted under 35 U.S.C. 154(b) by 0 days.

(21) Appl. No.: 15/503,932

(22) PCT Filed: Aug. 13, 2015

(86) PCT No.: PCT/US2015/045022
§ 371 (c)(1),
(2) Date: Feb. 14, 2017

(87) PCT Pub. No.: WO2016/025693
PCT Pub. Date: Feb. 18, 2016

(65) Prior Publication Data
US 2017/0287885 A1    Oct. 5, 2017

Related U.S. Application Data

(60) Provisional application No. 62/070,027, filed on Aug. 14, 2014.

(51) Int. Cl.
*H01L 23/495* (2006.01)
*H01L 25/16* (2006.01)
(Continued)

(52) U.S. Cl.
CPC ........ *H01L 25/16* (2013.01); *H01L 23/49503* (2013.01); *H01L 23/49517* (2013.01);
(Continued)

(58) Field of Classification Search
None
See application file for complete search history.

(56) References Cited

U.S. PATENT DOCUMENTS 4,667,403 A    5/1987  Edinger
5,396,403 A    3/1995  Patel
(Continued)

FOREIGN PATENT DOCUMENTS

EP    1926138 A1    5/2008
WO    9852226 A1    11/1998
WO    2016025693 A1    2/2016

OTHER PUBLICATIONS

Hashimoto et al., "A System-in-Package (SiP) With Mounted Input Capacitors for Reduced Parasitic Inductances in a Voltage Regulator," 2010, IEEE, 25(3), pp. 731-740.*
(Continued)

*Primary Examiner* — Duy T Nguyen
*Assistant Examiner* — Bo Bin Jang
(74) *Attorney, Agent, or Firm* — Rothwell, Figg, Ernst & Manbeck, P.C.

(57) ABSTRACT

Methods, systems, and devices for enabling the use of a special, generic, or standard substrate for similar system SIP assemblies are disclosed. The required customization, which is defined by a system's interconnecting scheme, is done during package assembly by creating appropriate connections using wire bonds on pads that are placed on the substrate and intentionally left open for purpose of customization. The wire bond links can be changed as required for a given system design.

10 Claims, 10 Drawing Sheets

(51) Int. Cl.

| | | |
|---|---|---|
| *H01L 23/498* | (2006.01) | |
| *H01L 23/538* | (2006.01) | |
| *H01L 23/00* | (2006.01) | |
| *H01L 25/00* | (2006.01) | |
| *H05K 1/11* | (2006.01) | |
| *H05K 1/18* | (2006.01) | |
| *H05K 3/32* | (2006.01) | |

(52) U.S. Cl.
CPC .. *H01L 23/49565* (2013.01); *H01L 23/49575* (2013.01); *H01L 23/49589* (2013.01); *H01L 23/49861* (2013.01); *H01L 23/5383* (2013.01); *H01L 23/5384* (2013.01); *H01L 23/5386* (2013.01); *H01L 24/48* (2013.01); *H01L 24/85* (2013.01); *H01L 25/50* (2013.01); *H05K 1/111* (2013.01); *H05K 1/115* (2013.01); *H05K 1/181* (2013.01); *H05K 3/32* (2013.01); *H01L 24/49* (2013.01); *H01L 2224/48227* (2013.01); *H01L 2224/48233* (2013.01); *H01L 2224/48247* (2013.01); *H01L 2224/49171* (2013.01); *H01L 2924/19041* (2013.01); *H01L 2924/19042* (2013.01); *H01L 2924/19105* (2013.01); *H01L 2924/19107* (2013.01); *H05K 2201/1003* (2013.01); *H05K 2201/10015* (2013.01); *H05K 2201/10287* (2013.01); *H05K 2201/10522* (2013.01)

(56) References Cited

U.S. PATENT DOCUMENTS

| | | | |
|---|---|---|---|
| 5,683,788 A | | 11/1997 | Dugan |
| 5,696,029 A | * | 12/1997 | Alvarez ............ H01L 23/49503 257/E23.037 |
| 6,133,626 A | | 10/2000 | Hawke |
| 6,268,238 B1 | | 7/2001 | Davidson |
| 7,060,535 B1 | * | 6/2006 | Sirinorakul ......... H01L 21/4832 438/123 |
| 8,065,576 B2 | | 11/2011 | Miner et al. |
| 9,490,188 B2 | | 11/2016 | Arvelo et al. |
| 2002/0017708 A1 | | 2/2002 | Takagi et al. |
| 2002/0052054 A1 | | 5/2002 | Akram |
| 2002/0170901 A1 | | 11/2002 | Lau |
| 2003/0110427 A1 | | 6/2003 | Rajsuman et al. |
| 2004/0229400 A1 | | 11/2004 | Chua |
| 2008/0029868 A1 | | 2/2008 | Lee |
| 2008/0288908 A1 | | 11/2008 | Hart et al. |
| 2008/0290486 A1 | * | 11/2008 | Chen ................... H01L 21/4828 257/676 |
| 2009/0278245 A1 | | 11/2009 | Bonifield et al. |
| 2010/0052135 A1 | * | 3/2010 | Shim, II ................ H01L 21/568 257/686 |
| 2010/0134133 A1 | | 6/2010 | Pagani |
| 2011/0233753 A1 | * | 9/2011 | Camacho ............ H01L 21/4832 257/692 |
| 2012/0241984 A9 | | 9/2012 | Pendse |
| 2013/0214386 A1 | | 8/2013 | Xie |
| 2015/0130040 A1 | | 5/2015 | Defretin |

OTHER PUBLICATIONS

International Search Search Report and Written Opinion issued in Application No. PCT/US2015/045022, dated Nov. 4, 2015, 14 pages.
International Search Report and Written Opinion issued in Application No. PCT/US16/50157, dated Jan. 17, 2017, 24 pages.
International Search Report and Written Opinion issued in Application No. PCT/US17/015728, dated Jun. 6, 2017, 16 pages.
International Search Report and Written Opinion issued in Application No. PCT/US17/49611, dated Dec. 27, 2017, 17 pages.
International Search Report and Written Opinion issued in Application No. PCT/US17/052014, dated Dec. 4, 2017, 15 pages.
International Search Report and Written Opinion issued in Application No. PCT/US18/16171, dated Apr. 25, 2018, 12 pages.
C.R. Schlottmann, "Analog Signal Processing on a Reconfigurable Platform", Master's Thesis, School of Electrical Computer Engineering, Georgia Institute of Technology, Aug. 2009, 72 pages.
J. McEleney, et al., "Multisite Test Strategy for SIP Mobile Technologies", Jul. 2006, 6 pages.
R. Normann, "First High-Temperature Electronics Products Survey 2005", Sandia Report, Apr. 2006, 44 pages.
S. Bernard, et al., "Testing System-In Package Wirelessly", IEEE, DTIS'06: Design and Test of Integrated Systems Technology, Sep. 2006, Tunis (Tunisia), pp. 222-226, http://hal-lirmm.ccsd.cnrs.fr/lirmm-00094916, Sep. 15, 2006.
D. Appello, et al., "System-in-Package Testing: Problems and Solutions", IEEE, May-Jun. 2006, 4 pages.
Z. Noun, et al., "Wireless Approach for SIP and SOC Testing", Micro and nanotechnologies/Microelectronics, Université Montpellier II—Sciences et Techniques du Languedoc, 2010, English, https://tel.archives-ouvertes.fr/tel-00512832, Aug. 31, 2010, 66 pages.
P. O'Neill, "Choosing the Right Strategy for SIP Testing", EE Times, Connecting the Global Electronics Community, May 10, 2004, 2 pages.
M., Quirk, et al., "Semiconductor Manufacturing Technology", IC Fabrication Process Overview, Chapter 9, Oct. 2001, 41 pages.
J. Watson, et al., "High-Temperature Electronics Pose Design and Reliability Challenges", Analog Dialogue 46-04, Apr. 2012, 7 pages.
S. Benjaafar, et al., "Batch Sizing Models for Flexible Manufacturing Cells", Submitted to International Journal of Production Research, Department of Mechanical Engineering, University of Minnesota, 1995, 43 pages.
C. T. Sorenson, "Semiconductor Manufacturing Technology: Semiconductor Manufacturing Processes", NSF/SRC Engineering Research Center for Environmentally Benign Semiconductor Manufacturing, Arizona Board of Regents for the University of Arizona, 1999, 34 pages.
"Downhole Solutions", Motion Control Solutions Tailored to Your Critical Downhole Applications, What Moves Your World, MOOG, May 2013, 8 pages.
A. Weintraub, "Is Mass Customization the Future of Retail?", https://www.entrepreneur.com/article/229869, Nov. 14, 2013, 5 pages.
International Search Report issued in International Application No. PCT/US2015/045022, dated Nov. 4, 2015, 2 pages.
Office Action issued for U.S. Appl. No. 15/968,184 dated Nov. 15, 2018, 25 pages.

\* cited by examiner

SUBSTRATE FOR SYSTEM IN PACKAGE (SIP) DEVICES

CROSS REFERENCE TO RELATED APPLICATION

This application is a 35 U.S.C. 371 National Phase Entry Application from PCT/US2015/045022, filed Aug. 13, 2015, which claims the benefit of U.S. Patent Application No. 62/070,027 filed on Aug. 14, 2014, the disclosures of which are incorporated herein in their entirety by reference.

TECHNICAL FIELD

This disclosure relates to packaging for one, two or more semiconductor circuits and other devices in a single package.

BACKGROUND

A System In Package ("SIP") can be used in the semiconductor industry to assemble multiple integrated circuits, other devices and passive components in one package. SIPs are attractive because they allow miniaturization of microelectronic systems. For instance, a printed circuit board ("PCB") that is tens of square centimeters in size can be miniaturized to a single package of approximately 5 square centimeters or less. SIPs enable integration of devices with diverse device fabrication technologies such as digital, analog, memories and other devices with components such as discrete circuits, devices, sensors, power management and other SIPs that are otherwise impossible or impractical to integrate in a single silicon circuit like an Application-specific Integrated Circuit ("ASIC") or System-on-a-Chip ("SoC"). SoC refers to a device used in the semiconductor industry that incorporates different functional circuit blocks on a single monolithic block of silicon to form one system circuit. The discrete circuits used in a SIP may include non-silicon based circuits.

Another benefit of a SIP is that it allows building prototypes to test a system prior to further integration of some or all of the components into a single monolithic silicon circuit to produce a SoC.

For conventional SIPs, also known as Multi-Chip Modules (MCMs), each new conventional SIP system requires a unique custom substrate. Such custom substrates often involve a unique design, extensive engineering, and extensive manufacturing set up costs, thus incurring high costs and longer cycle times. These are significant barriers where low costs and rapid prototyping are essential. These additional costs and longer cycle times also prevent development of low volume systems to take advantage of the added benefit of using a SIP for integration of multiple chips into a system. Accordingly, there is an unmet need for modifiable substrates and PCBs that can still perform all these important functions for a SIP.

SUMMARY

According to some embodiments, simplification of system design and board (PCB) design is achieved by reducing the number of layers used in a SIP, allowing for re-use of a single substrate for a family of systems by employing a wire bond array. The wire bond array allows the changing of wire bond connections depending on the wire bond connections needed by each system of the family, providing modifiable substrates and PCBs.

In some embodiments, an improved substrate for SIP devices is provided.

According to some embodiments, a system is provided for selectively interconnecting multiple circuits in a single package for a preselected system. The system uses a substrate containing a preselected number of device pads on its surface with each device pad having a preselected number of device wire bond pads. The substrate may also contain preselected conductive layers within the substrate, with each conductive layer containing etched portions. The substrate's surface also contains a preselected number of configuration pads arranged in an array and connected to preselected etched portions of said conductive layers using a plurality of vias. A plurality of circuits, each with external connectors for separate assembly, can be arranged on the device pads on the substrate and connected to the device wire bond pads associated with the die pad. Further, these circuits may then be interconnected using the device wire bond pads and configuration pads. To interconnect the circuits to form an integrated system, a preselected number of bond wires can be used to interconnect the configuration pads on the surface of the substrate. The circuits, substrate, and wire bonds may be contained within a package.

According to some embodiments, an improved integrated system is provided having a package, and a plurality of circuits mounted on a substrate wherein a portion of the substrate interconnections between said various circuits are made by interconnections in said substrate and additional preselected interconnections between said various circuits are predetermined using wire bonding techniques during the assembly process.

In certain aspects, embodiments enable the use of a common or standard substrate for a family of similar systems using an SIP assembly. The required system customization, which may be defined by a system's unique preselected interconnecting scheme, is done during assembly by creating appropriate preselected links with wire bonds between configuration pads that are strategically placed on the surface of the substrate and intentionally left open or not connected for the purpose of being able to make multiple, different and unique customized wire bond link patterns depending upon the system components used in a system and that system's application(s). These wire bond links can be changed as required by a system's design, for instance, just prior to final packaging. In some instances, the common or standard substrate may be used for systems that are significantly different in terms of components, intended use, operating characteristics, and/or complexity.

According to some embodiments, the substrate can also have multiple conductive layers for interconnection of different portions of circuits, in addition to the bond wires on the surface, for example, to handle the power rails and other common interconnections, so that changeable interconnections may be on the surface and fixed interconnections may be embedded in the substrate. For some implementations, the wire bond links may act as additional layers of the substrate, thus reducing the number of conductive layers within the substrate. The wire bond links provide the flexibility to reconfigure or reprogram the substrate and the associated components for a new system implementation.

According to some embodiments, a circuit mounting structure is provided. The structure may contain a lead frame for mounting pads for circuits and devices, lead fingers for interconnection with the circuits, and interconnection rails that may be attached to the frame.

According to another embodiment, a method for interconnecting circuits on a substrate is provided. In the method, a plurality of circuits is arranged on a substrate containing an array of configuration pads. The circuits are electrically connected with at least one configuration pad. Interconnections are then made between portions of the circuits using conductive layers. Interconnections between the circuits are also made using bond wires to connect one or more configuration pads.

In some embodiments, a lead frame is provided. The lead frame may contain external support framing, multiple lead fingers that may be removably attached to the framing, multiple die pads removably attached to the framing using lead fingers, and multiple internal interconnection rails removably attached to the framing.

According to another embodiment, a method for interconnecting circuits on a substrate is provided. In the method, a plurality of circuits is arranged on a substrate. On the surface of the substrate are configuration pads arranged in an array. The plurality of circuits is connected with at least two configuration pads. A connection between two configuration pads is then made using wire bonds to interconnect at least two circuits.

According to another embodiment, a method for assembling integrated systems is provided. In the method, a first plurality of circuits is arranged in a first configuration on a first substrate. On the surface of the substrate are a plurality of die pads and a plurality of wire bond pads. In certain aspects, each of the plurality of circuits is electrically connected with at least one of the plurality of wire bond pads. Also on the surface of the substrate is a plurality of configuration pads arranged in an array. Two or more of the plurality of configuration pads may then be connected using bond wires to interconnect the first plurality of circuits to form a first integrated system. A second set of circuitry is also arranged in a second configuration on a second substrate, wherein the second substrate has the same layout and structure as the first substrate. In some instances, the first and second substrate may be identical. Two or more of the plurality of configuration pads of the second substrate are then connected using bond wires to interconnect the second plurality of circuits to form a second integrated system, wherein the second integrated system differs from the first integrated system. In some instance, the first and second systems may be significantly different in terms of components, intended use, operating characteristics, and/or complexity.

These and other features of the invention will become apparent to those skilled in the art from the following detailed disclosure, taken together with the accompanying drawings.

BRIEF DESCRIPTION OF THE DRAWINGS

The accompanying drawings, which are incorporated herein and form part of the specification, illustrate various embodiments of the present disclosure and, together with the description, further serve to explain the principles of the disclosure and to enable a person skilled in the pertinent art to make and use the embodiments disclosed herein. In the drawings, like reference numbers indicate identical or functionally similar elements.

DETAILED DESCRIPTION

Figure 1A:
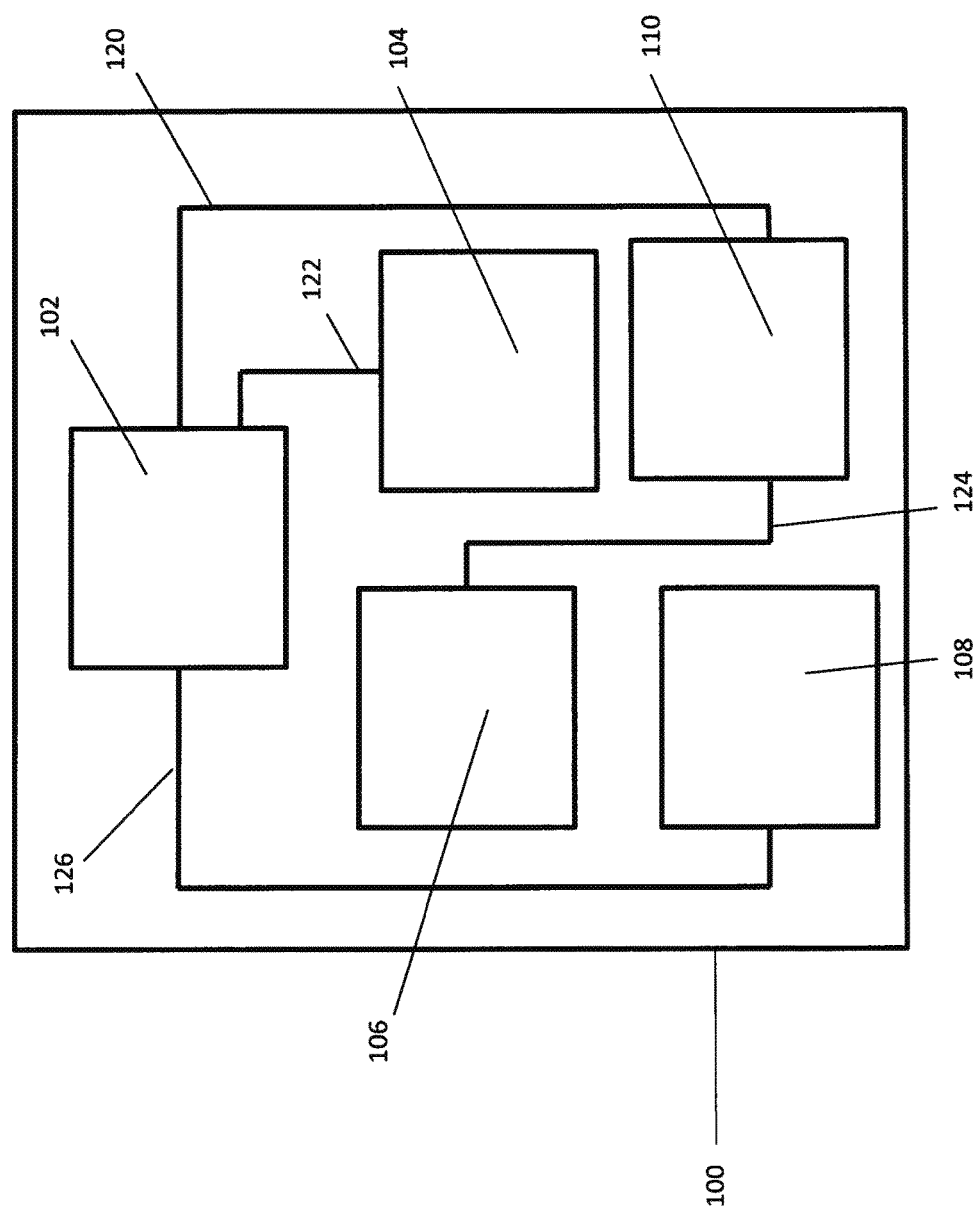
FIG. 1A is a diagram showing a prior art system board.

Referring now to FIG. 1A, the figure shows an outline of a prior art system Printed Circuit Board ("PCB") 100 with individual packaged components 102, 104, 106, 108, 110 assembled on it. The lines 120, 122, 124, and 126 between components 102, 104, 106, 108, and 110 depict interconnecting metal conductive traces in the same or different conductive layers in PCB 100 or on the surface of PCB 100. Although connections 120, 122, 124, and 126 are depicted as single lines for ease of illustration purposes, each may be multiple different interconnections between the components 102, 104, 106, 108, 110.

Figure 1B:
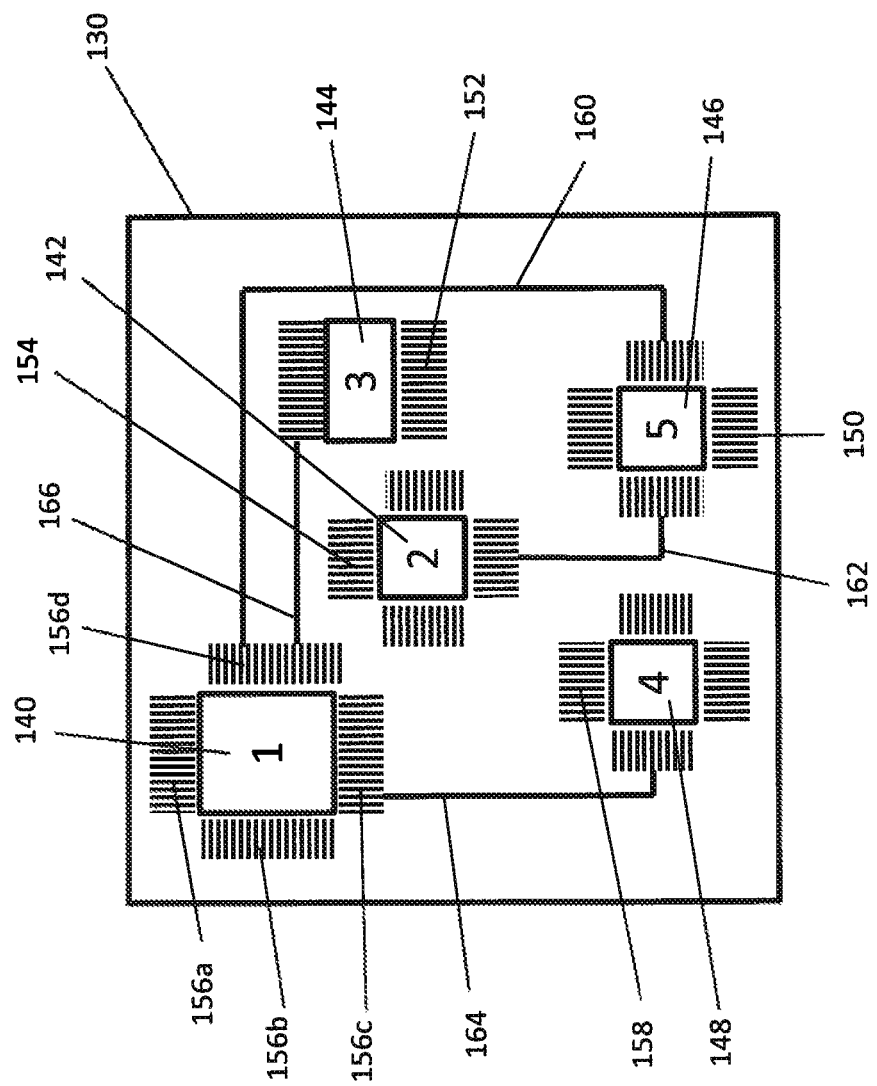
FIG. 1B is a diagram showing a prior art SIP implementation.

Referring now to FIG. 1B, the figure shows a prior art SIP configuration 130 for a similar set of devices 102, 104, 106, 108, and 110, but with unpackaged devices represented. In FIG. 1B, silicon die 140, 142, 144, 146, and 148 are representative of and replace the devices 102, 104, 106, 108, 110 from FIG. 1A and are assembled on to the SIP substrate 130 and wire bonded to the substrate. The SIP substrate has a die attach pad for each die and wire bond pads depicted collectively, for ease of illustration purposes, as 156a, 156b, 156c, 156d for die 140, and similarly for the remaining die 142 (wire bond pads 154), 144 (wire bond pads 152), 146 (wire bond pads 150), 148 (wire bond pads 158). The corresponding interconnections are located within the SIP substrate and are depicted by the representative interconnections 160, 162, 164, and 166. Although depicted as a single line for ease of illustration purposes, each interconnection may each represent multiple such interconnections. Because the die size is typically much smaller than the individual packaged components 102, 104, 106, 108, and 110 mounted on the PCB 100 of FIG. 1A, the resulting SIP size is much smaller. Nonetheless, the substrate board 130 for the SIP of FIG. 1B must be custom fabricated for any given system design because of the unique interconnections between the representative die 140, 142, 144, 146, and 148 needed for the desired system. The advantages of the SIP include the saving of space, reduced power, improved performance and the ability to use devices made with different technologies. The disadvantage is that each SIP substrate 130 is custom tooled and patterned with unique routing lines 160, 162, 164, and 166 because each system has its own unique net list. This results in higher design, tooling and qualification costs and longer lead times to fabricate samples.

Figure 1C:
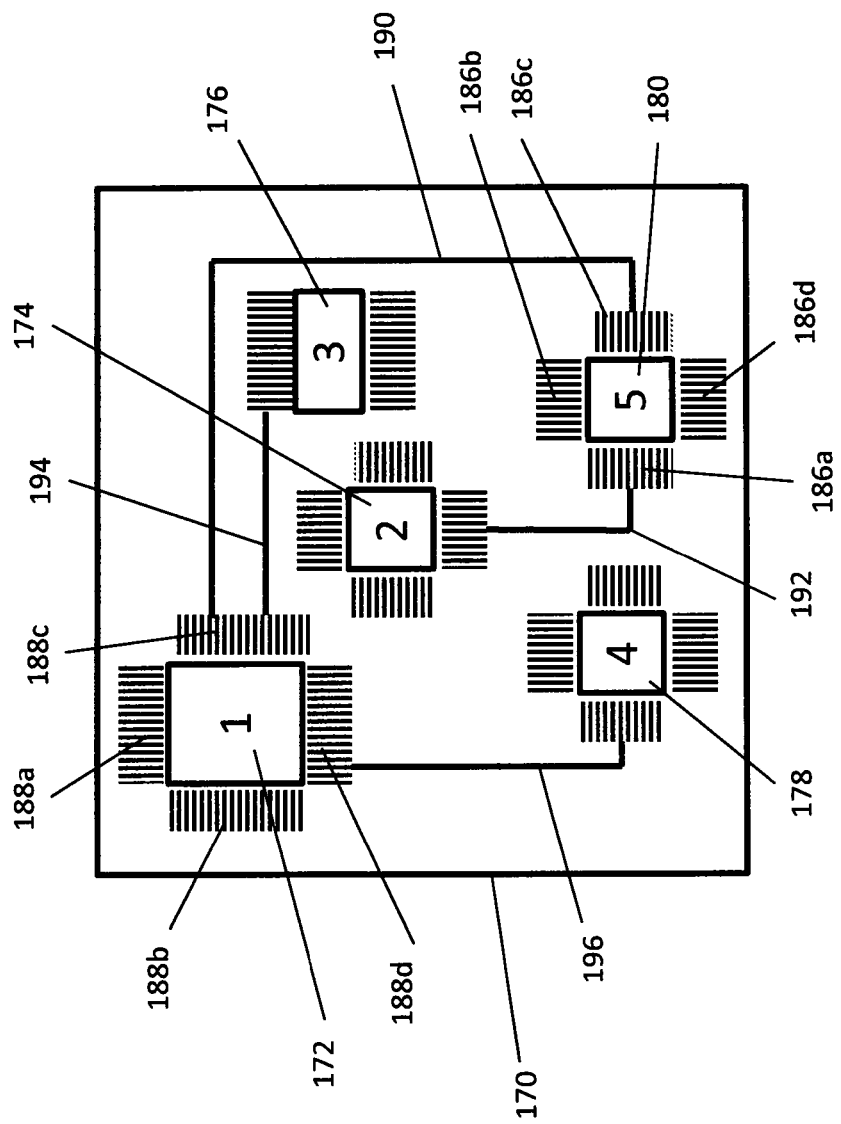
FIG. 1C is a diagram showing a prior art SIP implementation.

Referring to FIG. 1C, the figure shows a prior art SIP that depicts die pads 172, 174, 176, 178, and 180 and wire bond pads 188a, b, c, d for die 172 and similarly for the remaining die 174, 176, 178, and 180. In this example, the substrate is hard-wired, for instance, by etching metal traces 190, 192, 194, and 196 in the PCB 170 for the necessary interconnections as illustrated with the various lines 190, 192, 194, 196. For example, interconnection 190 connects one bond pad 188c of one die 172 to the bond pad 186c of a different die 180. Although depicted as a single interconnection for illustration purposes, each interconnection 190, 192, 194, 196 may each represent multiple such interconnections between multiple pads of a die. These interconnections may be on the surface of the PCB 170 or embedded in the substrate as one or more metal levels that are separately etched and appropriately insulated from other metal layers in making up the PCB, but connected to a die's wire bond pad(s) through a so-called via, as is well known in the semiconductor art.

Figure 2:
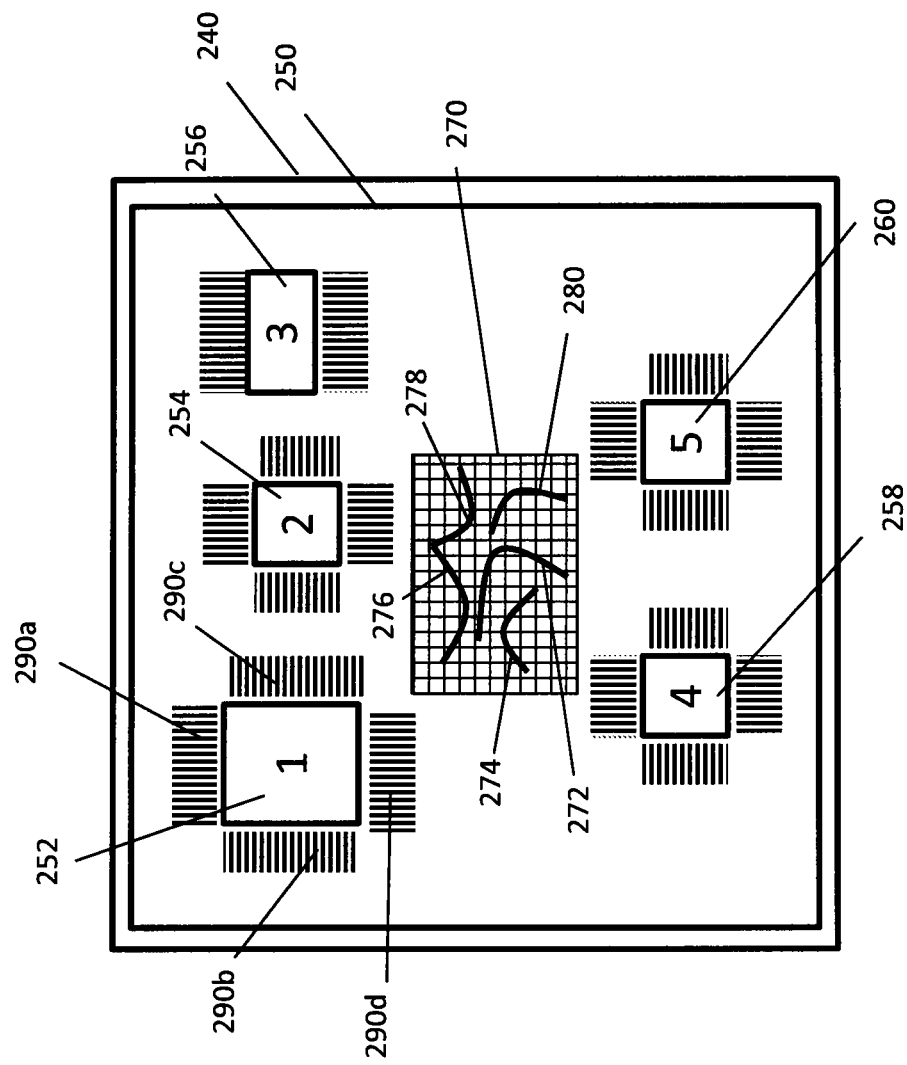
FIG. 2 is a diagram showing a system formed on a configurable SIP substrate in accordance with exemplary embodiments.

Referring to FIG. 2, the figure shows an embodiment of a package 240 containing a configurable SIP substrate 250, which includes die pads 252, 254, 256, 258, and 260. The figure also depicts wire bond pads 290(*a-d*) for die pad 252. Die pads 254, 256, 258, and 260 also may be similarly associated with wire bond pads. Substrate 250 further includes an array of configuration pads 270. Die pad 252 may be used to mount a die while wire bond pads 290(*a-d*) may be used to make a local connection between the substrate and die, or between the substrate and a circuit. The configuration pads found in array 270 are electrically coupled to the wire bond pads for subsequent use in interconnecting the individual die or circuits.

According to some embodiments, bond wires (also referred to as wire bonds) may be used to form connections between selected configuration pads of array 270 to interconnect selected circuits. According to certain aspects, the configuration pad array 270 is located in the center of substrate 250. In some embodiments, substrate 250 is a PCB using etched conductive layers and vias for fixed or hard-wired connections. In some respects, substrate 250 is only partially completed, and does not have all the required system connections, such as interconnections 190, 192, 194, and 196 depicted in FIG. 1C. The additional connections may be provided by wire bond connections between selected configuration pads.

Continuing to refer to the embodiment depicted in FIG. 2, an array of configuration pads 270 is depicted as fabricated on the surface of the SIP substrate (or PCB) 250 at a central location, but may be placed at any other desired location. Each configuration pad in the array 270 may be separately interconnected to one or more unique individual wire bond pad(s) 290(*a-d*) for die 252 and similarly for each of the other die 254, 256, 258, and 260 on the SIP substrate (or PCB) 250. In addition, there may be configuration pads included in the array 270 that are not directly connected to a wire bond pad, referred to as jumper pads, which can serve as jumper connectors for making longer distance connections between pads. In certain aspects, any desired or preselected interconnections between the circuits (e.g., 1-5) may be completed by wire bonding, using any selectable wire bond pattern (e.g., 272, 274, 276, 278, and 280) on the array's pads. This may include, for instance, use of one or more jumper pads.

In certain aspects, configuration pad array 270 transposes the pads from the circuit/die locations to a central location, or any other convenient location, for ease in making wire bond connections that are preselected and changeable. This wire bond pattern 272, 274, 276, 278, and 280 may be changed during assembly to achieve the required interconnections between the different system die as a function of the desired system application and the die or components used for the desired system. Some components may be the same electrically, but made by different manufacturers and have differing pinouts. The use of configuration pads, such as those shown in array 270, easily allows for this substitution of differing vendor components for the same equivalent component. Similarly, embodiments shown herein enable the packaging of multiple systems may be significantly different in terms of components, intended use, and/or complexity using a common or standard substrate.

SIPs in accordance with some embodiments enable integration of devices with diverse device fabrication technologies such as digital, analog, memories and other devices and components such as discrete circuits including devices, sensors, power management and even other SIPs that are otherwise impossible or impractical to integrate in a single silicon circuit like an ASIC or SoC. These other discrete circuits used in a SIP may include non-silicon based circuits.

Figure 3A:
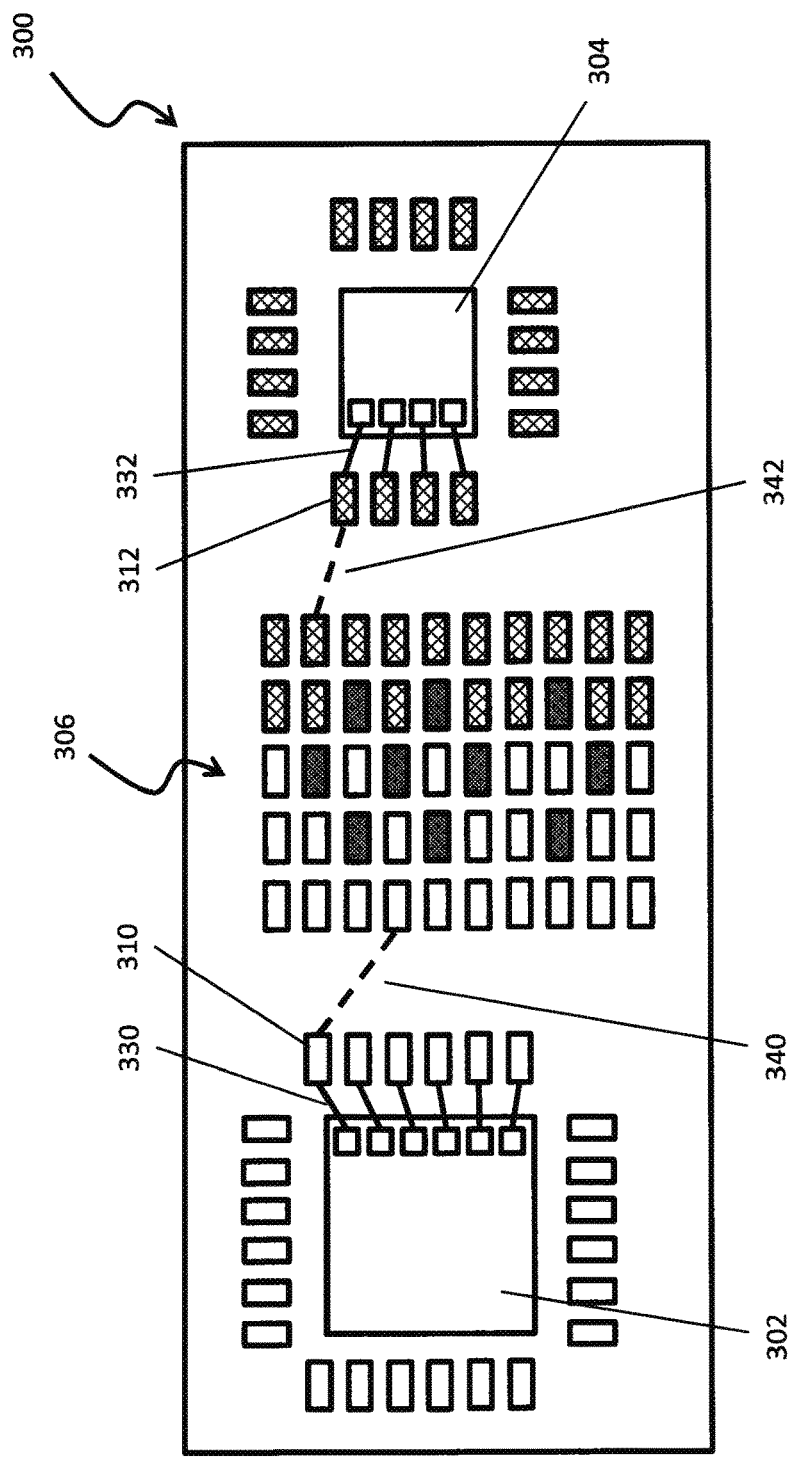
FIG. 3A is a diagram showing a 2-chip system in accordance with exemplary embodiments.

Referring to FIG. 3A, a two chip SIP substrate 300 in accordance with some embodiments is shown. In FIG. 3A, circuits 302 and 304 have external pads. For instance, circuit 302 has a total of 24 external pads and circuit 304 has 16 external pads. In some embodiments, circuits 302 and 304 may be individual devices.

Circuits 302 and 304 also include components for electrical connection to wire bond pads 310 and 312, respectively, such as associated lead fingers for a packaged circuit or bond wires for unpackaged die. The components may be used for electrically connecting circuit 302 or circuit 304 to wire bond pads on the surface of the substrate via the lead fingers (or bond wires). As depicted in FIG. 3A, lead finger 330 connects circuit 302 to wire bond pad 310 and lead finger 332 connects circuit 304 to wire bond pad 312. For ease of depiction purposes, other interconnections between circuits 302, 304 and with other external pads may exist but are not individually labelled. An array of configuration pads 306 is also depicted and is similar to the array of configuration pads 270 in FIG. 2. The configuration pads found in array 306 are electrically coupled to wire bond pads 310 and 312 using electrical connections 340 and 342, allowing the configuration pads to be subsequently used in interconnecting the individual circuits 302, 304. For ease of depiction purposes, other interconnections between circuits 302, 304 and additional wire bond pads and configuration pads may exist but are not individually labeled.

Figure 3B:
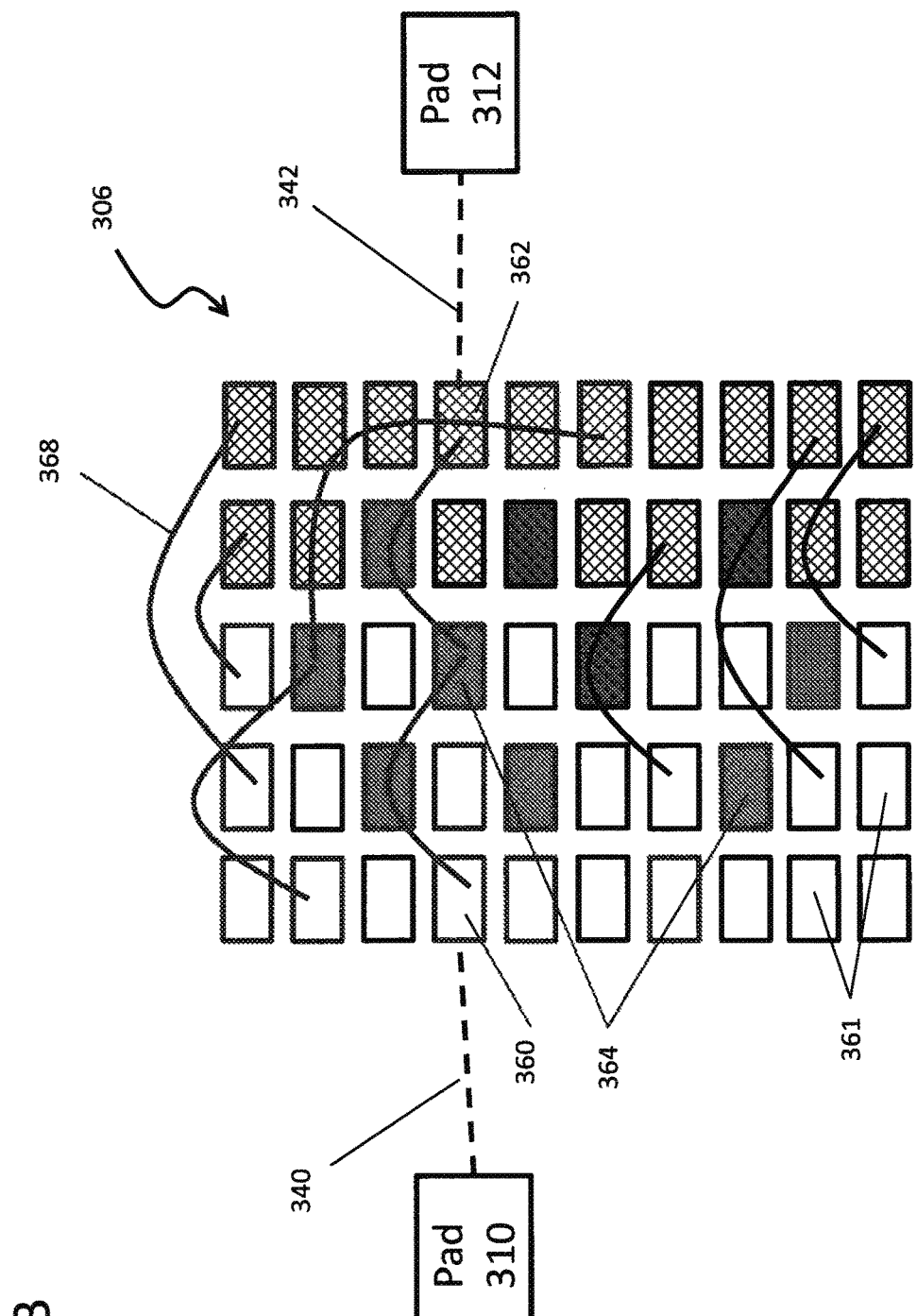
FIG. 3B is an expanded view of the array shown in FIG. 3A.

Referring to FIG. 3B, an expanded view of array 306 from FIG. 3A is provided. In this example, lead finger (or bond wire) 330 for circuit 302 of FIG. 3A has at least one associated configuration pad 360 in configuration pad array 306. Wire bond pad 310, which may be connected to circuit 302 via lead finger 330, may also be connected to configuration pad 360 using electrical connection 340. Similarly, for lead finger (or bond wire) 332 for circuit 304, there is corresponding pad 362. Wire bond pad 312, which may be connected to circuit 304 via lead finger 332, may also be connected to configuration pad 362 using electrical connection 342. Other connections between circuit 302, 304 and configuration pad array 306 may exist but are not labelled for ease of illustration purposes. Although depicted as being in the center of substrate 300, configuration pad array 306 may be multiple arrays in various locations on the substrate 300. The interconnection between any configuration pad in array 306 and an external pad associated with a circuit is made using the conductive etchings in the various layers of the substrate. Any configuration pad in the array may have multiple interconnections to other pads in the array or other elements on the substrate. For an exemplary substrate, the starting point for the PCB 300 may use etched conductive layers and vias for fixed or hard-wired connections and is only partially completed for all the system connections, such as interconnections 190, 192, 194, and 196 previously depicted in FIG. 1C, but not depicted in FIG. 3B, or rely on just the array 306 for all needed interconnections, including off-substrate connections for inputs, outputs and power.

Continuing to refer to FIG. 3B, a configuration pads 361 demonstrate that multiple configuration pads may be connected to a single wire bond pad and circuit 302. This connection may occur internally. This connection may also provide redundancy and help to facilitate wire bonding for either circuit 302 and/or circuit 304. FIG. 3B depicts configuration pads electrically connected to circuit 302 as "unfilled" rectangles and depicts configuration pads electrically connected to circuit 304 as "cross-hatched" rectangles. The array 306 may also have additional jumper pads 364 that are not connected to any layers within the substrate. FIG. 3B depicts the jumper pads 364 as "filled" rectangles. These jumper pads 364 may sit on the surface of the substrate and may be used, for example, to connect configuration pads 360 and 362 that are far from each other. Jumper pads 364 may also be used if there are other reasons to move the wire bond route, such as to avoid crosstalk between wires containing high frequency signals. Interconnections may also be made without the use of jumper pads 364 as seen from the connection formed with bond wire 368. Multiple such interconnecting bond wires may be employed for making the appropriate interconnections between die located on the substrate. Accordingly, the functionality of a system on the substrate may be easily programmed during assembly and changed as needed by simply using a different preselected set of interconnections by means of a different set of bond wires between the configuration pads in the array representing the circuit on the substrate.

Figure 4:
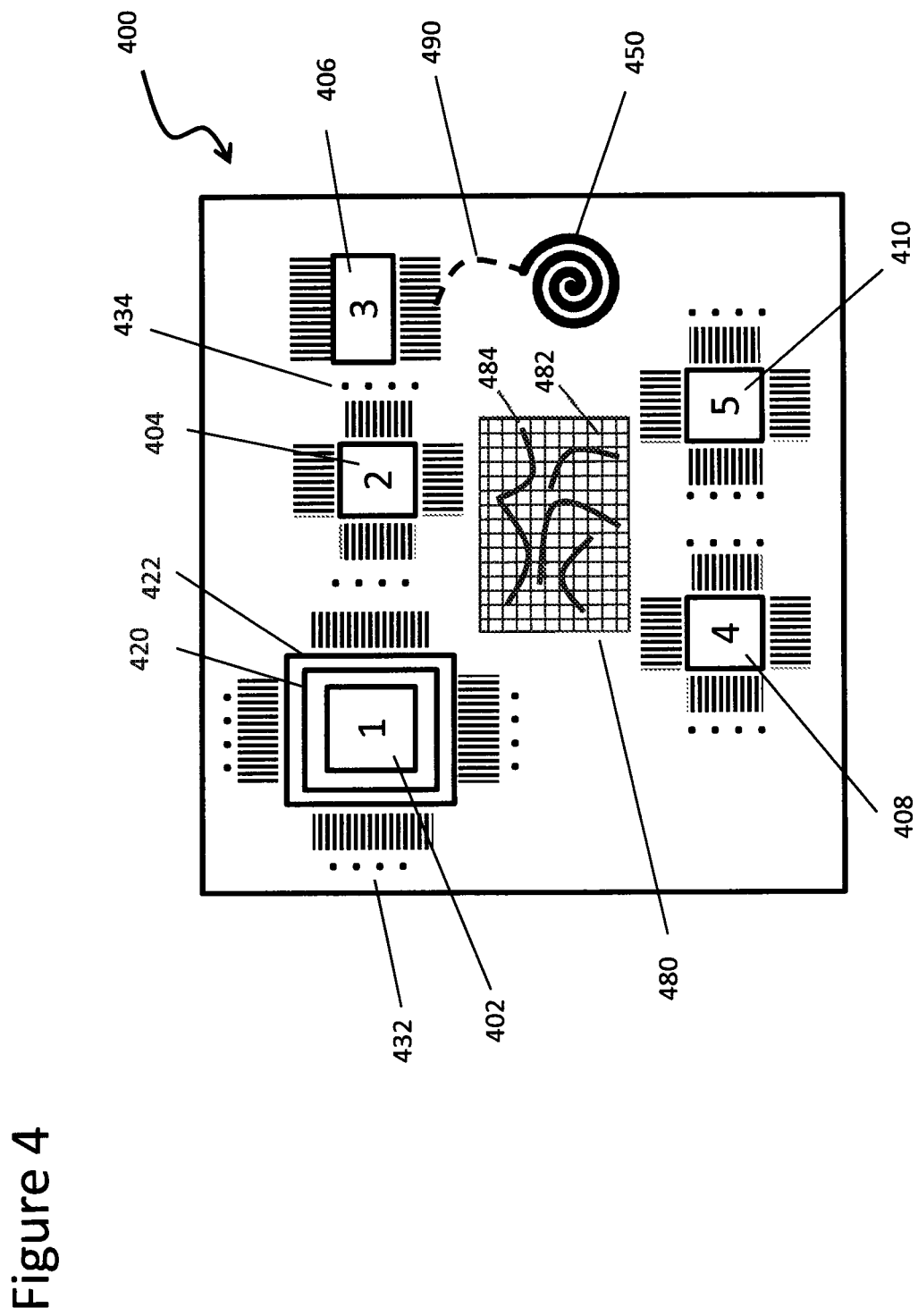
FIG. 4 is a diagram showing a system in accordance with exemplary embodiments.

Referring to FIG. 4, substrate 400 is shown. According to some embodiments, additional power and ground connections, such as a power ring 420 and a ground ring 422, are provided around die pad 402. These rings 420, 422 allow flexibility in wire bonding for power and ground from any peripheral location on a chip or die. Additional circuits or die 404, 406, 408, and 410 are depicted each with their associated die pads. An array 480 of configuration pads is also depicted. Further, although an inductor 450 and decoupling capacitor pads 432, 434 are depicted for die 402, 404, other passive circuit elements (like resistors) may be so placed and utilized. Similar capacitor pads are depicted near the die wire bond pads for die 408, 410. The inductor 450 is depicted as interconnected to a wire bond pad for die pad 406 via bond wire 490. Although not illustrated, bond wire 490 may also interconnect with any pad in array 480, rather than a wire bond pad for die pad 406. In a similar manner, bond wires 482, 484 make interconnections in the array for components (which may be active and/or passive elements) on the substrate 400 located at die pad locations 402, 404, 406, 408, and 410 during assembly. PCB 400 may use etched conductive layers and vias for fixed or hard-wired connections or may rely on making all interconnections using the array 480.

Figure 5:
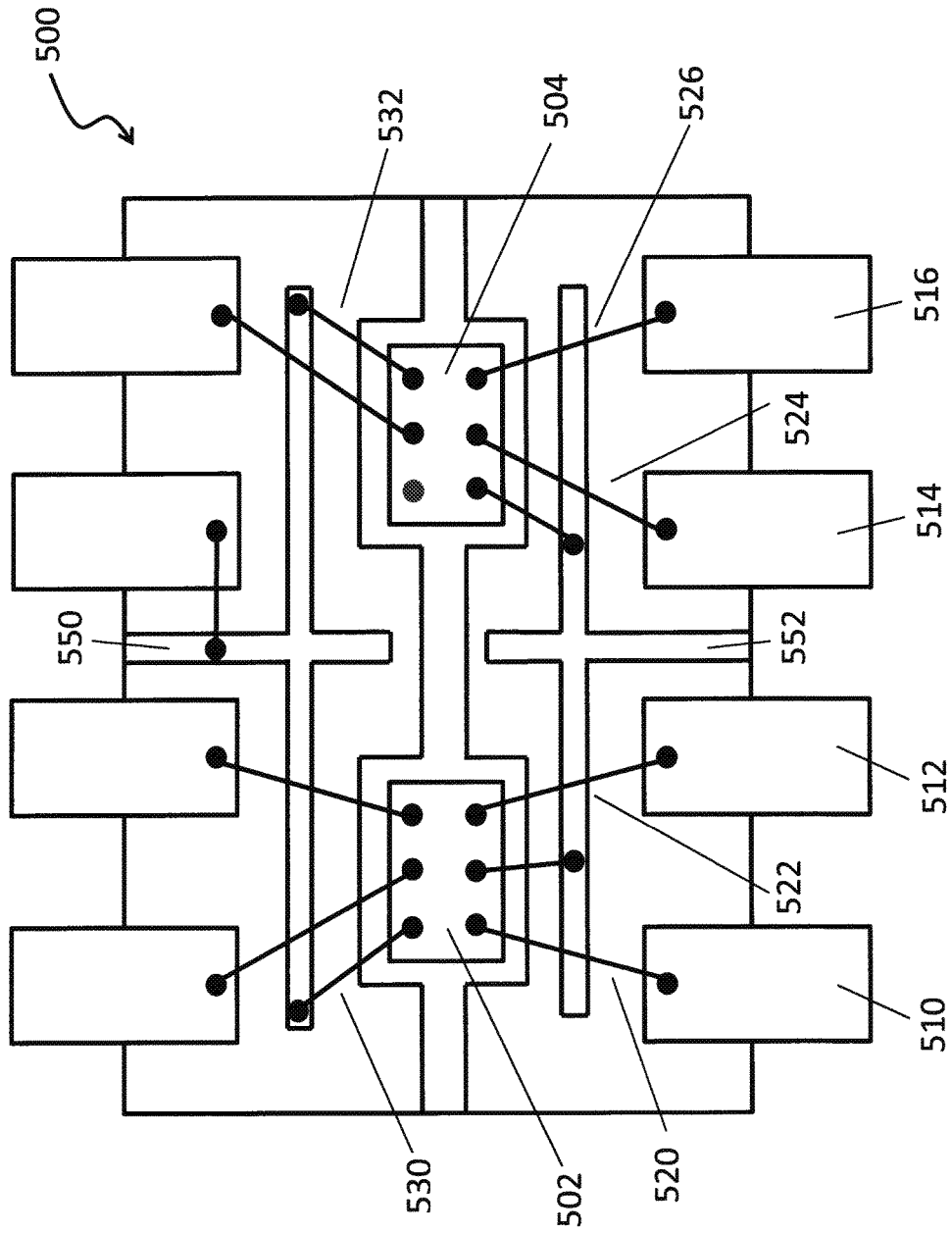
FIG. 5 is a diagram showing a 2-chip leadframe in accordance with exemplary embodiments.

Referring to FIG. 5, a 2-chip leadframe package 500 in accordance with certain embodiments is shown. Package 500 includes 2 die pads 502, 504. Bond wires 520, 522, 524, and 526 illustrate the interconnections between the die and the leads 510, 512, 514, and 516 for the package 500. A metal rail 550 is provided in the middle of the package interconnected to the leadframe support structure. This metal rail 550 may be used as a jumper rail to connect to pads on the far side of the chip 504 or it may be used as a power or a ground rail. Only 2 such rails 550, 552 are depicted in FIG. 5. Bond wires 530, 532 illustrate the interconnections between the die and metal rail 550 made during assembly. A leadframe package may contain a plurality of such rails. These rails are connected to the rest of the leadframe support structure during leadframe fabrication, but the support section extending from the rail to the leadframe structure is trimmed off and isolated during the package singulation operation, when the rest of the lead frame support structure is removed. In FIG. 5, the array 306 of FIG. 3B is replaced by metal rails or fingers 550, 552 that serve the same function as the array of pads for making selectable interconnections. In the case of leadframe packages, an associated leadfinger may be wire bonded to an isolated leadframe pad, which may be used as a junction for connecting two or more different chips contained within the leadframe package or for connecting two or more portions of the same chip.

Figure 6:
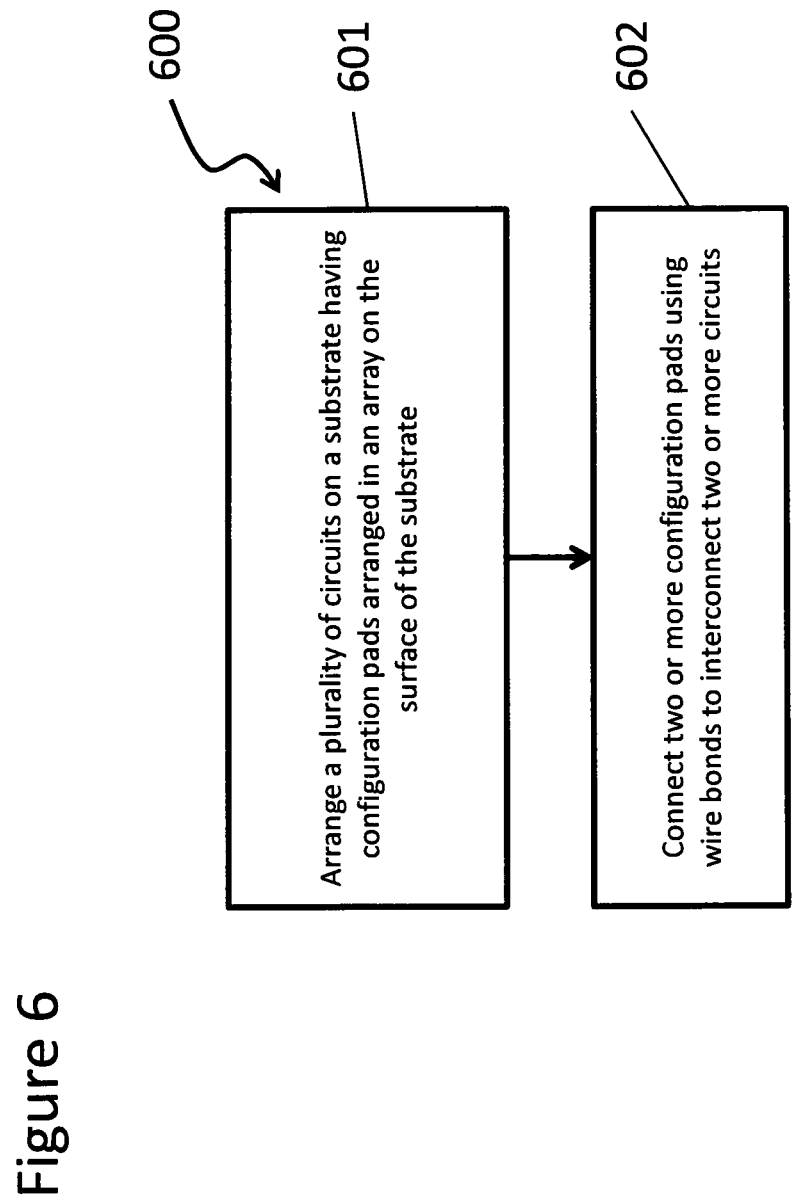
FIG. 6 is a flow chart illustrating a method for interconnecting circuits on a substrate in accordance with an exemplary embodiment.

Referring now to FIG. 6, a flow chart 600 illustrating a method for interconnecting circuits on a substrate is shown. In the first step 601 of method 600, a plurality of circuits is arranged on a substrate, for instance, substrate 250. The circuits may be one or more of sensors, memories, digital, analog, or other discrete devices and components such as power management, other SIPs, substrates, communication or non-silicon based circuits. In an exemplary embodiment, the substrate contains configuration pads arranged in an array 270 on the substrate surface, and the plurality of circuits is electrically connected to at least two configuration pads. In step 602, two or more configuration pads are connected using wire bonds to interconnect at least two circuits.

Figure 7:
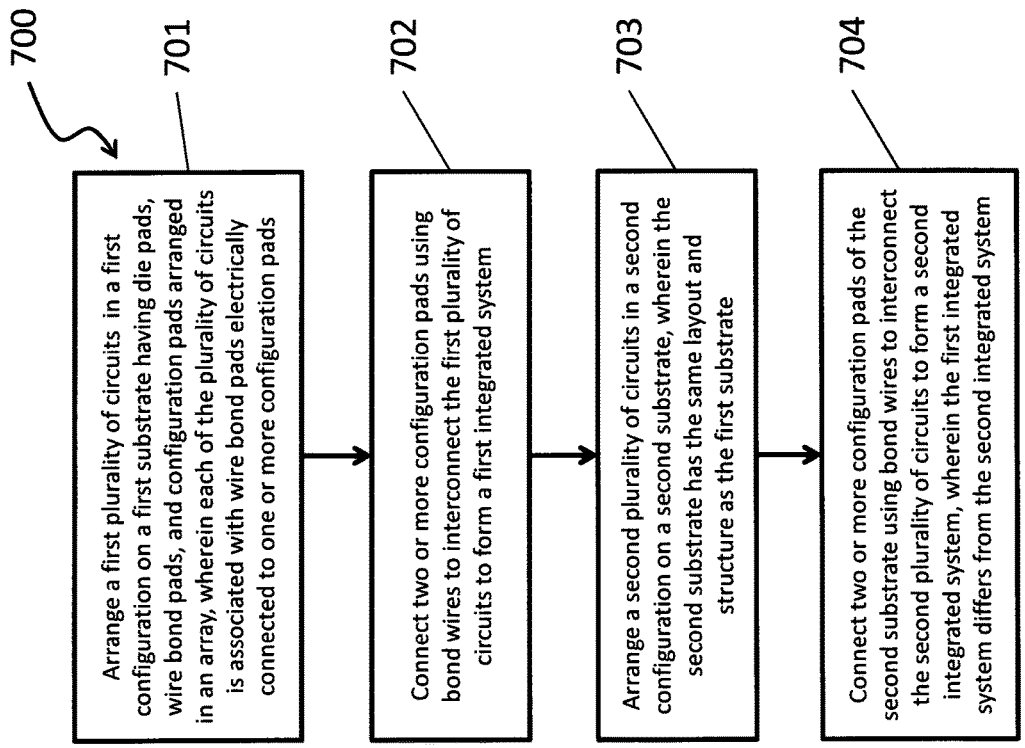
FIG. 7 is a flow chart illustrating a method for system integration in accordance with an exemplary embodiment.

Referring now to FIG. 7, a flow chart 700 illustrating a method for system integration is shown. In the first step 701 of method 700, a first plurality of circuits is arranged in a first configuration on die pads of a first substrate, such as substrate 250. In an exemplary embodiment, the circuits on the first substrate are associated with wire bond pads for electrical connection to the substrate. Further, the wire bond pads are electrically connected to configuration pads. The configuration pads may be arranged in an array form, such as an array of configuration pads 270. In some embodiments, the plurality of circuits includes at least one external connector for electrical connection to the substrate at the wire bond pads. Further, the circuits may be one or more of sensors, memories, digital, analog, or other discrete devices and components such as power management, other SIPs, substrates, communication or non-silicon based circuits.

In step 702, two or more configuration pads are connected using, for example, bond wires to interconnect the first plurality of circuits to form a first integrated system. In an exemplary embodiment, at least one configuration pad of the array is a jumper pad not directly connected to a wire bond pad. In some embodiments, the jumper pads may be used to connect configuration pads. Configuration pads may be connected in a manner to minimize wire length.

In step 703, a second set of circuits is arranged in a second configuration on the die pads of a second substrate. In an exemplary embodiment, the second configuration differs from the first configuration; however, the second substrate has the same layout and structure as the first substrate. In certain aspects, the first and second substrates may be identical. The circuits on the second substrate are associated with wire bond pads for electrical connection to the second substrate. Further, the wire bond pads are electrically connected to configuration pads. The configuration pads may be arranged in array form. Further, the second set of circuits may be one or more of sensors, memories, digital, analog, or other discrete devices and components such as power management, other SIPs, substrates, communication or non-silicon based circuits.

In step 704, two or more configuration pads on the second substrate are connected using bond wires to interconnect the second plurality of circuits to form a second integrated system. In an exemplary embodiment, at least one configuration pad of the array is a jumper pad not directly connected to a die pad. In some embodiments, the jumper pads may be used to connect configuration pads. Configuration pads may be connected in a manner to minimize wire length. According to certain aspects, the second integrated system differs from the first integrated system. In some embodiments, the first and second systems may be significantly different in terms of components, intended use, and/or complexity using a common or standard substrate.

While this disclosure has described certain exemplary embodiments, the present invention is not necessarily limited to these embodiments. Accordingly, other embodiments, variations, and improvements not described herein are not excluded from the scope of the present invention. Such variations include but are not limited to new substrate material, different kinds of devices not discussed, but well-known, in the semiconductor art that may be attached to a substrate or new packaging concepts that may be employed. Various changes, substitutions and alterations can be made herein without departing from the spirit and scope of the invention as defined by the appended claims.

The invention claimed is:

1. A package, comprising:
   a substrate containing one or more conductive layers, wherein said one or more conductive layers are connected to one or more device wire bond pads on a surface of said substrate using at least one via of a plurality of vias,
   wherein said substrate comprises a plurality of configuration pads on said surface of said substrate arranged in at least one array and connected to said one or more conductive layers with one or more vias of said plurality of vias;
   a plurality of circuits with external connectors assembled on said surface of said substrate using said one or more device wire bond pads;
   wherein at least one device wire bond pad of said one or more device wire bond pads is electrically connected to at least one of said plurality of configuration pads through said one or more conductive layers of said substrate; and
   one or more bond wires interconnecting portions of said plurality of circuits using two or more of said configuration pads,
   wherein said plurality of circuits, said substrate, and said bond wires are contained within the package.

2. The package of claim 1, wherein said one or more device wire bond pads, said plurality of circuits, and said plurality of configuration pads are located on a top surface of said substrate.

3. The package of claim 1, wherein said substrate further comprises: preselected inputs and outputs are interconnected with another set of external connectors on the outside of said package.

4. The package of claim 1, wherein said plurality of circuits comprises one or more of the following:
   sensors, memories, digital components, analog components, other discrete devices, power management components, other SIPs, substrates, communication components or non-silicon based circuits.

5. The package of claim 1, wherein at least one of said plurality of configuration pads is a jumper pad.

6. The package of claim 1, wherein said substrate is a common substrate configured to apply to systems having different components or operating characteristics.

7. A package for system integration, comprising:
   a substrate comprising a plurality of die pads on an upper surface of said substrate,
   wherein each of said plurality of die pads has one or more associated device wire bond pads,
   wherein said substrate contains one or more conductive layers having etched portions that connect to a plurality of configuration pads on said upper surface of said substrate using at least one via,
   wherein said configuration pads are arranged in at least one array;
   a plurality of circuits assembled on said die pads on said upper surface of said substrate having external connectors for separate connection with one or more of said device wire bond pads; and
   one or more bond wires interconnecting portions of said plurality of circuits using said one or more configuration pads on said upper surface of said substrate.

8. A substrate, comprising:
   a number of conductive layers within a substrate containing etched portions;
   a plurality of configuration pads on a surface of said substrate arranged in at least one array and interconnected with said etched portions; and
   a plurality of die pads arranged on said surface of said substrate, wherein each die pad has one or more associated device wire bond pads interconnected with said etched portions for interconnecting said one or more associated device wire bond pads with said plurality of configuration pads.

9. The substrate of claim 8, wherein said substrate further comprises:
   at least one inductor having bond pads associated with said at least one inductor.

10. The substrate of claim 9, wherein said substrate further comprises:
   one or more attachments for one or more capacitors.

* * * * *